United States Patent [19]

Bhattacharya et al.

[11] Patent Number: 4,463,059

[45] Date of Patent: Jul. 31, 1984

[54] LAYERED METAL FILM STRUCTURES FOR LSI CHIP CARRIERS ADAPTED FOR SOLDER BONDING AND WIRE BONDING

[75] Inventors: Somnath Bhattacharya, Wappingers Falls, N.Y.; Dudley A. Chance, Danbury, Conn.; Nicholas G. Koopman, Hopewell Junction; Sudipta K. Ray, Wappingers Falls, both of N.Y.

[73] Assignee: International Business Machines Corporation, Armonk, N.Y.

[21] Appl. No.: 394,014

[22] Filed: Jun. 30, 1982

[51] Int. Cl.³ .............................................. H05K 3/06
[52] U.S. Cl. .................................... 428/620; 428/617; 428/628; 428/671; 357/68; 357/71; 357/80
[58] Field of Search ............... 428/620, 628, 617, 671; 357/80, 68, 71

[56] References Cited

U.S. PATENT DOCUMENTS

| | | | |
|---|---|---|---|
| 3,607,379 | 9/1971 | Leinkram et al. | 428/601 |
| 3,777,220 | 12/1973 | Tatusko et al. | 357/80 |
| 3,843,911 | 10/1974 | Horton et al. | 428/601 |
| 4,231,154 | 11/1980 | Gazdik et al. | 357/80 |

*Primary Examiner*—Veronica O'Keefe
*Attorney, Agent, or Firm*—Graham S. Jones, II

[57] ABSTRACT

The top surface metallurgy of LSI chip carriers is improved by multiple and phased interface of metal layers which enable such metallurgies to be suitable for joining by solder reflow and wire bonding techniques. The modifications result in separating the solder bonding metallurgy from the fan-out conductor metallurgy with an intermediate layer of a metal such as Cr or Ti which prevents the formation of intermetallic alloys which are mechanically weak or brittle and tend to fracture because of thermal fatigue stresses caused by thermal cycling during either multiple (up to 50) solder bonding reflow operations or operation of the circuit. The fan-out metallurgy conductors are preferably composed of Cr-Cu-Cr layers covered by at least one upper metal layer which is separated from the Cu of the conductor by means of a metal such as phased layers of Cr or Ti deposited before the other upper metal layer or layers. Solder ball bonding surfaces are composed of additional metal in the form of Au, Cu and Ni. The solderless bonding surfaces are composed of a metal selected from Au, Cr, Ti, Al and Co.

11 Claims, 8 Drawing Figures

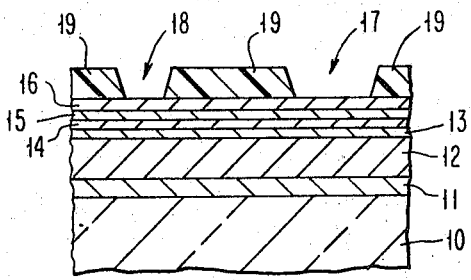
FIG. 1
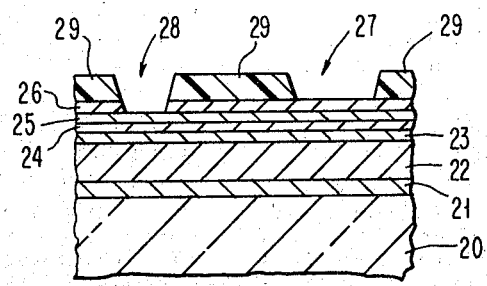
FIG. 2
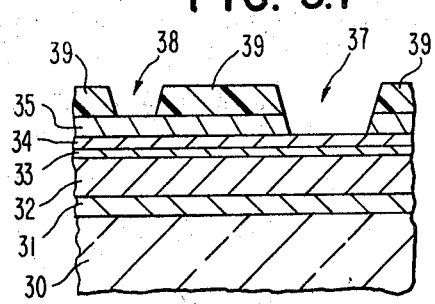
FIG. 3.1
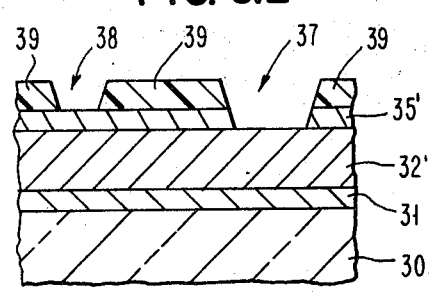
FIG. 3.2
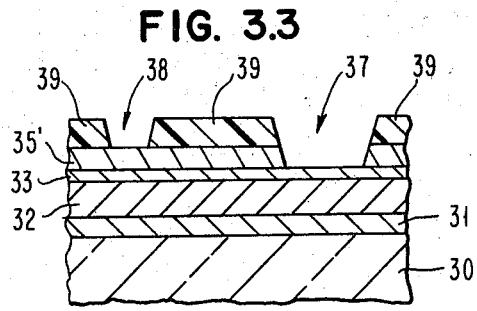
FIG. 3.3

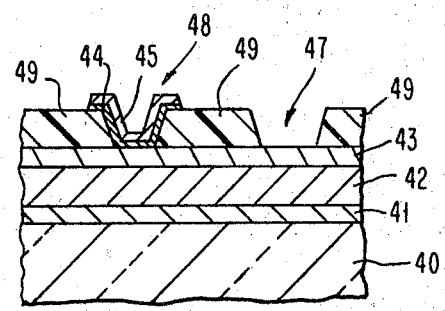
FIG. 4.1
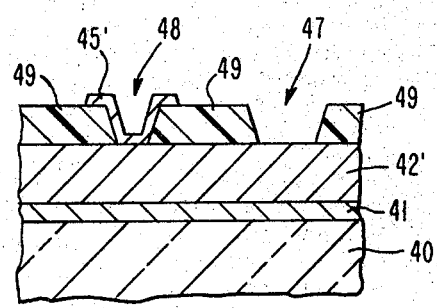
FIG. 4.2
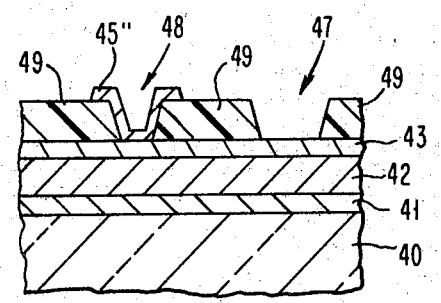
FIG. 4.3

4,463,059

LAYERED METAL FILM STRUCTURES FOR LSI CHIP CARRIERS ADAPTED FOR SOLDER BONDING AND WIRE BONDING

BACKGROUND OF THE INVENTION

1. Technical Field

This invention relates to packaging of LSI chips and more particularly to the metallurgy of conductor lines and connection pads for solder bonding and wire bonding.

2. Background Art

On the upper surface of a multilayer ceramic chip carrier there is an arrangement of chip sites each with an array of C-4 solder ball pads which are adapted to provide connection to chips by means of bonding of solder balls by heating of Pb/Sn solder balls to a temperature permitting solder bonding of the solder balls to the pads by heating above the bonding temperature of the solder balls carried on the lower surface of the chip to be bonded to the chip carrier. Connected between the solder pad areas and other sites on or in the chip carrier are so-called fan-out lines which extend along the top surface of the chip carrier beneath a layer of insulation. At certain locations on the surface of the chip carrier, it is necessary to make pads available for engineering change wiring to be connected to the fan-out metallurgy. However, the engineering change wiring is connected to the pads by the processes of wire bonding either by ultrasonic vibration or by thermo compression techniques. The metallurgical requirements for solder bonding as contrasted with requirements for wire bonding techniques differ. As a result, there is a metal structure for line connection, a second structure for chip joining and a third structure adapted for engineering change connections or bonds. Heretofore, the top surface metallurgy has been complicated and the materials employed have required many selective metal deposition steps. For example, in one system of chip packaging, the solder pads are composed of a sandwich of Mo—Ni—Au layers and the EC pads and lines are Mo—Ni layers of metal coated with a thick film of Au. Such an array of metallic layers is deposited upon the multiple layers of the fan-out metallurgy. It is necessary under such circumstances to use an entirely different multiple step process for both the solder pads and the EC pads and lines.

U.S. Pat. No. 3,607,379 of Leinkram et al for "Microelectronic Interconnection Substrate" describes an interconnection substrate consisting of an insulative alumina ceramic wafer carrying a first metal layer of chromium, for example, to metallurgically bond a second silicon-eutectic-forming layer such as gold to the substrate. Deposited on the gold layer is a third weldable or tin-lead solderable layer such as a nickel film. Films are photolithographically etched to produce a number of gold and nickel pads suitable for interconnection of microelectronic elements. A lead from a diode is connected by welding to a nickel pad on top of a chromium layer. A gold wire is thermally bonded to an exposed pad on the gold layer. The gold film or pad provides a surface to which resistive elements, semiconductors and other components may be interconnected by means of gold-silicon eutectic formation and by gold wires attached by thermal compression or ultrasonic bonding. The nickel pads provide surfaces to which microcomponents or external leads are tin-lead soldered or welded. Alternatively, the first layer forming an adhesion layer is composed of Cr, Ti, or Al. The second layer is composed of a metal such as Au or Ag. The third or top layer for bonding by thermal compression bonding or ultrasonic bonding is composed of Rh, Ag, Cu, Ni or the like with Ni and Cu preferred as being solderable and weldable and allowing physically stable electrical connections to gold-nickel layers. On the other hand, in accordance with this invention, it is preferred that the solder bonding should be made to metals selected from Au, Cu, or Ni as contrasted to Au or Ag in the case of Leinkram with the metal adapted to ultrasonic or thermal compression solderless bonding in accordance with this invention is selected from Au, Cr, Ti, Al, or Co. The Leinkram patent teaches ultrasonic or thermal compression bonding to Au or Ag. Thus, while some similarity in the metal for solder bonding exists in the case of use of Au on the solder pads, the other metals for solder bonding and thermal compression and ultrasonic bonding metals are quite distinct. Employing the Leinkram design, there is a high possibility of formation of thick intermetallics between the copper conductor and the tin in the solder leading to fracture of the conductor lines when repeated heat cycling is applied.

U.S. Pat. No. 3,843,911 of Horton et al describes a contact pad arrangement with a substrate of copper plated with an intermediate layer selected from Ni, Cr and Mo with the top layer composed of Au. A gold wire is bonded to the gold layer on the top of the pad by ohmic bonding.

U.S. Pat. No. 4,231,154 of Gadzik "Electronic Package Assembly Method" teaches provision of Cr-Cu-Cr metallurgy for printed circuits on polyimide carrying a C-4 mounted chip bonded by solder bonding. FIG. 4I shows a pad formed of Cu which is formed by stripping away the Cr layer on that portion of the Cr-Cu-Cr stack. The C-4 solder balls are bonded to the Cu layer which has been exposed. There is no suggestion of using a different form of bonding than solder bonding to the upper surface. Pins are bonded to the metallurgy by means of solder bonding also, at different sites.

SUMMARY OF THE INVENTION

An object of this invention is to provide simplified metallic film structures for the top surface of high performance chip packaging modules.

Another object of this invention is to provide gold or non-gold thin film structures to which ultrasonic or thermo compression bonds can be made to wires connecting to connection pads or terminals. A further object of this invention is to provide a barrier layer in the metallurgy which separates the fan-out conductor metallurgy from the solder pad metallurgy to eliminate metallurgical alloying between metals which tend to increase electrical resistance and to produce weak intermetallic alloys which are brittle and tend to fracture because of thermal fatigue stresses caused by thermal cycling either during solder reflow in manufacture or repair or by heat produced during circuit operation. In other words this invention provides multilayer film structures to which solder bonds are made and which are capable of retaining their conductive and structural integrity after many heat cycles in those areas which are soldered.

An additional object of this invention is to provide a thin film structure for wire bonding and pressure contact to wires to be attached to a packaging module.

FIG. 1 shows a sectional schematic view of a fragment of a substrate adapted for carrying an LSI chip, with metallurgy in accordance with this invention which includes fan-out metallurgy below with solder pads and other bonding pads above.

FIG. 2 is a modification of FIG. 1 with a different upper metallurgy, with the solder pad cut into one layer.

FIG. 3.1 shows still another modification of FIG. 1 in accordance with this invention with the bonding layer cut into the upper layer.

FIGS. 3.2 and 3.3 are further modifications of FIG. 3.1.

FIGS. 4.1, 4.2 and 4.3 are various modifications of FIG. 1 wherein the solder bonding pad is formed over the insulating coating above the metallurgy on the top surface of the chip carrying substrate.

DESCRIPTION OF THE PREFERRED EMBODIMENT

FIG. 1 shows a sectional view of a substrate employed for supporting an LSI chip. A substrate material 10 composed of glass, polyimide or a ceramic is coated with a thin adhesion layer 11 about 80 nm thick which is composed of a material such as Cr, Ti, or other group IVB, VB, or VIB metals selected from Ti, Zr, Hf, V, Nb, Ta, Cr, Mo, and W. The next layer 12 is about 7,000 nm (within a range of about 5,000 nm to 10,000 nm) of a conductor metal such as Cu which in turn is coated with a thin layer 13 of a metal such as Cr, Ti, etc. from the group of metals listed above. Layers 11, 12 and 13 comprise the conductor sandwich of the chip fan-out metallurgy which connects transversely within the top surface of the chip package. The top surface metallurgy above the conductor sandwich is composed of layers 14, 15 and 16 which are connected at terminal pad locations (for C-4 solder ball joints) on the fan-out metallurgy where pads 18 for connection to the chip are located and engineering change (EC) pad locations 17 are located. Layer 14 is 40 nm of Cr and 40 nm of Cu phased from Cr to Cu. Layer 15 is 210 nm of Cu (within a range of 100–400 nm) and layer 16 is 80 nm of Au. The structure is formed by use of standard thin film technology. The layers 11 to 16 can be deposited by vacuum deposition techniques such as evaporation or sputtering. For small patterns the metal is deposited into a lift-off mask such as polysulfone coated with a film of photoresist. The mask is exposed and openings are made in the mask by conventional means to provide the pattern of metallization desired. In the case of FIG. 1, TSM layers 14, 15 and 16 are deposited on all of the conductor layers 11, 12 and 13 of the fan-out metallurgy. This simplifies the process of fabrication. Then once all of the metal layers 11–16 have been deposited, the polysulfone is dissolved by a solvent of n-methyl pyrrolidone and the resist, the remaining polysulfone, and the metal layers on top of the resist are all lifted off the substrate 10 leaving the desired metallization behind. Alternatively a metal mask of Mo is used where the mask openings are larger than about 0.0254 mm in size. The metal layers 11 to 16 are deposited through the mask in a desired pattern on the substrate. Then the entire surface of the remaining structure and the exposed surface of the substrate are coated with a layer of a dielectric coating 19 such as polyimide, $SiO_2$ or $Si_3N_4$ which covers the metal layer 16. Next, holes 17, 18 are cut in the polyimide 19 down to the layer of the top surface of layer 16 to provide connections to the C-4 solder ball connections in the use of hole 18 and the engineering change pads exposed by hole 17 for connection of wires which must be connected to the pad by ultrasonic or thermo compression wire bonding techniques. Because the top layer 16 is composed of gold (or an equivalent noble metal such as Pd, Pt, Rh or Ag) the solder bonding techniques for the solder balls and the wire bonding techniques for the engineering change wires can both be practiced with the same surface 16.

FIG. 2 shows a modified structure of the arrangement of FIG. 1 wherein the lower three layers 21, 22 and 23 forming the fan-out metallurgy are again very similar with 80 nm of Cr in layer 21, 7,000 nm of Cu in layer 22 and 100 nm of Cr in layer 23 as preferred embodiments. Those values and materials are identical to the preferred values and materials for layers 11, 12 and 13 respectively.

The next layer 24 is formed (as is layer 14 in FIG. 1) by a layer of about 40 nm of Cr phased into 40 nm of Cu. Layer 25 comprises about 210 nm of Cu (as is layer 15 in FIG. 1). However, in the case of the top layer 26, the metal used is Cr about 80 nm thick. As the Cr metal is inappropriate for solder bonds with C-4 solder ball connections, the Cr is removed in the C-4 pad areas 28. Again in this case, the layers 21, 23 and 26 of Cr can be formed of other metals similar to Cr such as Ti or other group IVB, VB or VIB metals. The portion of layer 26 under the opening 28 for the pads for C-4 solder balls is preferably removed by a technique such as etching with 62 g/l of potassium permanganate ($KMnO_4$) and 20 g/l of NaOH solution, which selectively removes the upper Cr layer from the C-4 pads.

The process used for deposition of the layers of the conductors in the fan-out metallurgy and the upper layers of the TSM is a one step lift-off process or a one step evaporation process. Then the entire structure is coated with a film of a polymer such as polyimide for layer 29 and then the polyimide is opened at the C-4 windows 28 and the EC pads 27 by means of reactive ion etching. The Cr in the C-4 pad areas is removed by means of the etchant for the Cr or other metal in layer 26. The process for protecting the EC areas 27 from the etchant for Cr is the usual photoresist coating selectively deposited at areas where no Cr etching is desired.

FIG. 3.1 shows a modification of the structure of FIG. 2 wherein the lower four layers 31–34 on substrate 30 are identical to the lower four layers 21–24 on substrate 20 and the top layer 35 is of the same thickness of Cu or the equivalent as the layer 25 in FIG. 2. The difference is that the layer 35 is etched at the EC pad locations 37 and is not etched at the C-4 solder ball pads 38. In this case, the etching of the copper is performed by means of an $FeCl_3$ solution of 0.35 gr of $FeCl_3$ in 1 liter of deionized water, for a Bumay Scale value of about 30°.

The process of fabrication of the device in this case employs one step evaporation of the metal layer followed by a one step lift-off of the photoresist plus the excess metal. The resulting product of the lift-off step is followed by coating with polyimide. The C-4 and EC windows 38 and 37 are opened by reactive ion etching through a suitable mask such as silicon nitride.

The C-4 areas are masked by photoresist and then the copper in layers 34 and 35 is etched away in the EC area to expose the layer of Cr or its equivalent in layer 34.

FIG. 3.2 shows a modification of FIG. 3.1 in which layers 33 and 34 are omitted and the layers 32' and 35' are preferably composed of different metals from those in layers 32 and 35 in FIG. 3.1.

Layer 32' is preferably composed of Al and layer 35' is preferably composed of Ni which is removed from the EC pad areas 37 as in FIG. 3.1.

FIG. 3.3 shows a substrate 30 again carrying four layers of metallurgy modified from FIG. 3.1 by the elimination of layer 34 and the use of various metals in layer 32 such as Cu and Au plus the use of nickel or copper in layer 35'. In TABLE I below examples are given of the various combinations of sets of layers which can be employed.

TABLE I

| Set | Layer | | | |
|---|---|---|---|---|
| | 31 | 32 | 33 | 35' |
| A | Cr | Cu | Cr | (Ni) |
| B | Cr | Au | Co | (Ni) |
| C | Cr | Au | Cr | (Cu) |
| D | Cr | Au | Cr | (Ni) |

In the case of set B it should be noted that Co has been substituted for Cr as a diffusion barrier between Au and Ni. In addition the layer 35' is indicated in parentheses in order to make it clear that the portions of the nickel or copper film, which is in the EC area 37, is removed by etching. In the case of set C the etching is performed with the FeCl₃ solution as in FIG. 3.1 In the case of etching of Ni, the etchant employed comprises a nitric acid solution. Otherwise the basic process of fabrication is the same as for FIG. 3.1.

FIG. 4.1 shows another modification of the structure shown in previous figures with the lower layers 41, 42 and 43 being the same as in FIG. 1, etc. composed of 80 nm of Cr, 7,000 nm of Cu and 80 nm of Cr in a conventional fan-out metallurgy arrangement, with layers of C-4 metallurgy 44 and 45 deposited into and over the edges of the opening for the C-4 opening 48. Layer 44 comprises a phased transition of 40 nm each of Cr and Cu deposited on the structure. In addition, the top layer 45 in the opening 48 is composed of about 210 nm of Cu metal which is adapted to joining to C-4 solder ball joints.

FIG. 4.2 shows a modification of the packaging arrangement of FIG. 4.1 wherein the layer 43 is eliminated in an arrangement in which the layer 42' is composed of a metal such as Al or its equivalents such as Al alloys or Au. The reason that Al can be used as the material which is exposed at the EC pad area 47 is that Al forms a thin protective oxide layer which is readily dispersed during a wire bonding operation such as ultrasonic bonding. Layer 41 is Cr or its equivalents such as Ti, etc. mentioned above. Layer 45' on the solder ball pad area 48 is composed of a metal such as Ni or its equivalents such as Cu, Pd and Pt.

FIG. 4.3 shows a different modification of the structure of FIG. 4.1 wherein the layer 44 in C-4 opening 48 is substituted for by layer 45" which is a different metal such as Ni or Cu and there is no metallic layer 45 on top of layer 45". Variations of the sets of layers in the arrangement of FIG. 4.3 are shown in TABLE II below.

TABLE II

| Set | Layer | | | |
|---|---|---|---|---|
| | 41 | 42 | 43 | 45" |
| A | Cr | Cu | Cr | (Ni) |
| B | Cr | Au | Cr | (Cu) |
| C | Cr | Au | Cr | (Ni) |
| D | Cr | Au | Co | (Ni) |

Having thus described our invention, what we claim as new and desire to secure by Letters Patent is:

1. A packaging substrate for integrated circuits including
a fan-out metallurgical structure including a conductor formed near the surface of the substrate,
a plurality of barrier layers overlying said structure,
said barrier layers being located above said conductor,
said barrier layers including in one layer a material adapted for providing solder pads having a surface adapted for the soldering of connections to said conductor
and another layer of said barrier layers including a material adapted for thermal bonding whereby said layers permit the connection of said conductor to other pad connections by soldering and thermal bonding solderlessly alternatively,
with some areas on the surface of said barrier layers comprising solder bonding surfaces and other areas on the surface of said barrier layers comprising thermal bonding surfaces with the solderless bonding surfaces comprising a metal selected from the group consisting of Au, Cr, Ti, Al and Co and the solder bonding surfaces comprising a metal selected from the group consisting of Au, Cu and Ni.

2. A substrate in accordance with claim 1 wherein
a base metallurgy layer of said conductor overlies said substrate,
and said base metallurgy layer of said conductor comprises Cr or Ti.

3. A substrate in accordance with claim 2 wherein
a second layer comprising the conductive layer of said conductor overlies said base metallurgy layer and said second layer comprises Cu and
a third layer overlying said second layer
and said third layer comprises Cr
with the succeeding layers comprising Cr, Cu, and Au with the layer of Au on the surface adapted for inclusion in the solder pad surfaces and the other pad surfaces being adapted for solderless connections.

4. A substrate in accordance with claim 2 wherein
a second layer comprising the conductive layer of said conductor overlies said base metallurgy layer and said second layer comprises Cu, and
a third layer of said conductor overlying said second layer, comprises Cr,
a fourth layer overlying said third layer providing a said barrier layer from said conductor,
said fourth layer comprises Cr and Cu in that order and
an upper layer wherein said upper layer comprises a material selected from Cr and Ti with said upper layer removed in the solder pad surface areas.

5. A substrate in accordance with claim 2 wherein
a second layer comprising the conductive layer of said conductor overlies said base metallurgy layer and said second layer comprises Cu
a third layer of said conductor overlying said second layer, said third layer comprises Cr a fourth layer overlyng said third layer wherein said fourth layer comprises Cr and Cu in that order and a fifth layer of Cu overlying said fourth layer with the Cu removed in the solderless bonding areas leaving Cu for solder bonding in the solder bonding surface areas.

6. A substrate in accordance with claim 2 wherein a base metallurgy layer of said conductor overlies said substrate, said base metallurgy layer of said conductor comprising a metal selected from the group consisting of Cr and Ti, a second layer comprises the conductive layer of said conductor overlying said base metallurgy layer and said second layer comprises Al, and a third layer of said conductor overlying said second layer, said third layer comprises a barrier layer Ni with the solder bonding surfaces being the exposed surfaces of said third layer, and the solderless bonding surfaces comprising openings to said second layer.

7. A substrate in accordance with claim 2 wherein a second layer comprising the conductive layer of said conductor overlies said base metallurgy layer and said second layer is composed of copper or gold, a third layer of said conductor overlying said second layer, said third layer is composed of a metal selected from the group consisting of Cr and Co and a fourth layer overlying said third layer wherein said fourth layer is composed of a metal selected from the group consisting of Ni and Cu with the solder bonding surface being formed on the surface of said fourth layer and a solderless bonding area being formed on the surface of said third layer in areas opened in said fourth layer.

8. A substrate in accordance with claim 2 wherein a second layer comprising the conductive layer of said conductor overlies said base metallurgy layer and said second layer is composed of Cu a third layer of said conductor overlying said second layer and said third layer is composed of Cr which is exposed in the solderless bonding areas of the structure, with at least one opening made for the solder bonding areas in a coating layer into which is deposited a metallic layer of Cr covered with a layer of Cu.

9. A substrate in accordance with claim 2 wherein a base metallurgy layer of said conductor overlies said substrate, and said base metallurgy layer of said conductor comprises Cr or Ti, a second layer comprising the conductive layer of said conductor overlies said base metallurgy layer and said second layer is composed of a material selected from the group consisting of Al alloys of Al and Au and a solderless bonding surface is formed by exposed area of the second layer with openings in the upper layer of said barrier layers, said openings extending down to the second layer formed in a coating layer with a layer of material selected from the group consisting of Ni, Cu, Pd and Pt deposited into said openings to form the solder bonding surface.

10. A substrate in accordance with claim 2 wherein a second layer comprising the conductive layer of said conductor overlies said base metallurgy layer and said second layer is composed of Cu, a third layer of said conductor overlying said second layer and said third layer being composed of a metal selected from the group consisting of Cr and Co, a dielectric coating overlying said third layer, solderless bonding areas being formed by openings through said dielectric coating on the surface of said third layer, with the solder bonding areas formed by deposition of a layer of a metal selected from the group consisting of Ni and Cu on the third layer in the desired areas, through openings in said dielectric coating.

11. A packaging substrate for integrated circuits including a fan-out metallurgical structure including a conductor layer therein, said structure being formed near the surface of the substrate, at least one barrier layer of a metal overlying said structure, said barrier layer being located above said conductor, said barrier layer comprising a material adapted for providing solder pads having a surface adapted for the soldering of connections to said conductor selected from the group consisting of Ni, Cu, Pd and Pt, and openings in said barrier layer exposing said conductor in said a structure for solderless connnections to said conductor layer.

* * * * *